United States Patent
Matsuda et al.

(10) Patent No.: US 9,607,922 B2
(45) Date of Patent: Mar. 28, 2017

(54) SEMICONDUCTOR DEVICE AND HEAT-DISSIPATING MECHANISM

(71) Applicant: Tanaka Kikinzoku Kogyo K.K., Tokyo (JP)

(72) Inventors: Kenji Matsuda, Nirasaki (JP); Dai Shinozaki, Nirasaki (JP); Yuichi Makita, Tsukuba (JP); Hitoshi Kubo, Tsukuba (JP); Yusuke Ohshima, Tsukuba (JP); Hidekazu Matsuda, Tsukuba (JP); Junichi Taniuchi, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 0 days.

(21) Appl. No.: 14/778,684

(22) PCT Filed: Mar. 3, 2014

(86) PCT No.: PCT/JP2014/001441
§ 371 (c)(1),
(2) Date: Sep. 21, 2015

(87) PCT Pub. No.: WO2014/156025
PCT Pub. Date: Oct. 2, 2014

(65) Prior Publication Data
US 2016/0049350 A1   Feb. 18, 2016

(30) Foreign Application Priority Data
Mar. 26, 2013 (JP) .................. 2013-063939

(51) Int. Cl.
*H01L 23/34* (2006.01)
*H01L 23/367* (2006.01)
(Continued)

(52) U.S. Cl.
CPC .......... *H01L 23/367* (2013.01); *H01L 23/34* (2013.01); *H01L 23/36* (2013.01); *H01L 23/373* (2013.01);
(Continued)

(58) Field of Classification Search
CPC ........ H01L 23/34; H01L 23/373; H01L 24/01
(Continued)

(56) References Cited

U.S. PATENT DOCUMENTS 7,332,807 B2 * 2/2008 Dani ................... H01L 23/3737
257/706
2002/0124955 A1 * 9/2002 Tung ................... B32B 37/0015
156/300

(Continued)

FOREIGN PATENT DOCUMENTS

JP    2003-529934 A    10/2003
JP    2005-056967 A    3/2005
(Continued)

OTHER PUBLICATIONS

Japanese Office Action, dated Aug. 5, 2016, issued in Japanese Application No. 2013-063939, including a machine translation in English.
(Continued)

*Primary Examiner* — Matthew E Warren
(74) *Attorney, Agent, or Firm* — Orrick Herrington & Sutcliffe, LLP

(57) ABSTRACT

A semiconductor device includes a semiconductor chip which can be a heat-generating semiconductor chip or a semiconductor relay substrate in which an integrated circuit or wiring is built in. A sintered-silver-coated film is adhered on a surface layer part of the semiconductor substrate, interposed by a silicon oxide film. A heat-dissipating fin (heat sink), which may be copper or aluminum, is bonded on the sintered-silver-coated film, interposed by an adhesive layer.

4 Claims, 16 Drawing Sheets

(51) Int. Cl.
    *H01L 23/00*    (2006.01)
    *H01L 23/373*   (2006.01)
    *H01L 23/36*    (2006.01)
    *H05K 7/20*     (2006.01)
(52) U.S. Cl.
    CPC .......... *H01L 23/3736* (2013.01); *H01L 24/01* (2013.01); *H05K 7/20409* (2013.01); *H01L 2924/0002* (2013.01)
(58) Field of Classification Search
    USPC ........................................ 257/676, 712, 717
    See application file for complete search history.

(56) References Cited

U.S. PATENT DOCUMENTS

| | | | |
|---|---|---|---|
| 2011/0012262 A1* | 1/2011 | Morita | H01L 24/29 257/741 |
| 2011/0030938 A1* | 2/2011 | Liu | F28F 21/02 165/185 |

FOREIGN PATENT DOCUMENTS

| | | |
|---|---|---|
| JP | 2005-294356 A | 10/2005 |
| JP | 2006-005111 A | 1/2006 |
| JP | 2006-210611 A | 8/2006 |
| JP | 2010-539683 A | 12/2010 |
| JP | 2012-052198 A | 3/2012 |
| JP | 2012-162767 A | 8/2012 |
| JP | 2013-004576 A | 1/2013 |
| JP | 2013-012706 A | 1/2013 |
| JP | 2013-037773 A | 2/2013 |

OTHER PUBLICATIONS

International Preliminary Report on Patentability and Written Opinion of the International Searching Authority for International Application No. PCT/JP2014/001441, dated Sep. 29, 2015.

* cited by examiner

| SAMPLE | | HUMIDITY DURING FIRING TREATMENT | | |
|---|---|---|---|---|
| | | < 6.0 g/m³ | 12.1 g/m³ | 18.2 g/m³ |
| [Si] | | 0% No.1 | 96% No.2 | 98% No.3 |
| [SiN] | | 81% No.4 | 3% No.5 | 100% No.6 |

Fig. 10

SEMICONDUCTOR DEVICE AND HEAT-DISSIPATING MECHANISM

TECHNICAL FIELD

The present invention relates to a heat dissipation mechanism and a semiconductor device allowing heat generated from a semiconductor substrate or a semiconductor package to dissipate through a heat spreader.

BACKGROUND ART

A semiconductor chip equipped with an integrated circuit (particularly, CPU) and a power transistor generating a large amount of heat is generally has an air-cooled or water-cooled heat sink mounted thereon. A semiconductor relay substrate (e.g., silicon interposer) equipped with a semiconductor chip generating a large amount of heat has a similar heat sink mounted thereon.

To increase adhesion and thermal conductivity between such a semiconductor substrate generating a large amount of heat and a heat sink for efficient heat dissipation, a member called heat spreader (typically, a metal plate or a metal film) is joined on a heat dissipation surface of the semiconductor substrate to achieve a configuration such that the heat sink is connected directly or via a joining layer to the heat spreader. Copper, copper alloy, and aluminum are frequently used as a material of the heat spreader. A metal paste, a thermally-conductive adhesive, a solder, a thermally-conductive grease, etc. are used for joining the semiconductor substrate and the heat spreader.

PRIOR ART DOCUMENT

Patent Document

Patent Document 1: Japanese Laid-Open Patent Publication No. 2006-210611

SUMMERY OF THE INVENTION

Problem to be Solved by the Invention

To maintain favorable operation of an electronic device equipped with a semiconductor element generating a large amount of heat, it is important to allow the heat generated by the semiconductor device to efficiently dissipate so as not to exceed an upper limit of allowable temperature.

However, a conventional heat dissipation mechanism has a metal plate heat spreader joined to a semiconductor substrate via a joining layer made of a metal paste, a thermally-conductive adhesive, a solder, or a thermally-conductive grease and is not sufficient in terms of performance and reliability of a cooling function because of a factor of deterioration in thermal conductivity resulting from occurrence of void, stress, fatigue, etc. in the joining layer.

A heat sink is often mounted via a heat spreader also on a semiconductor package radiating a large amount of heat and the same problem occurs in relation to the heat spreader also in this case.

On the other hand, if a metal deposited film or a metal sputter film is formed instead of a metal plate as a heat spreader on a semiconductor substrate, an expensive vacuum film deposition apparatus is required.

Therefore, it is considered advantageous for a heat spreader used in a semiconductor chip, a semiconductor relay substrate, a semiconductor package, etc., to achieve a form using silver having the highest thermal conductivity as a material and a form of a silver coating film formed by a coating method from the perspective of simplification of a film deposition apparatus without using a joining material such as solder.

The present invention was conceived from the viewpoint described above in view of the problems of the conventional techniques and provides a heat dissipation mechanism and a semiconductor device improving adhesion, thermal conductivity, and cost performance of a heat spreader attached to a heat-generating semiconductor substrate or a heat-generating semiconductor package.

Means for Solving the Problem

A semiconductor device in a first aspect of the present invention comprises a heat-generating semiconductor substrate incorporated with an integrated circuit or wirings; a silver thin film manufactured from nano-silver particles and formed by a coating method in a closely adhering manner on one surface of the semiconductor substrate; and a silicon oxidation film having a film thickness of 1 nm (nanometer) or more formed at an adhesion interface between the semiconductor substrate and the silver thin film.

A semiconductor device in a second aspect of the present invention comprises a heat-generating semiconductor package housing a heat-generating semiconductor substrate incorporated with an integrated circuit or wirings; a silver thin film manufactured from nano-silver particles and formed by a coating method in a closely adhering manner on one surface of the semiconductor package; and a silicon oxidation film having a film thickness of 1 nm (nanometer) or more formed at an adhesion interface between the semiconductor package and the silver thin film.

A heat dissipation mechanism of the present invention is a heat dissipation mechanism for dissipating heat generated from a heat-generating semiconductor substrate or a heat-generating semiconductor package comprising a silver thin film manufactured from nano-silver particles and formed by a coating method in a closely adhering manner on one surface of the semiconductor substrate or semiconductor package; and a silicon oxidation film having a film thickness of 1 nm (nanometer) or more formed at an adhesion interface between the semiconductor substrate and the silver thin film.

Effect of the Invention

The semiconductor device and the heat dissipation mechanism of the present invention can improve adhesion, thermal conductivity, and cost performance of a heat spreader attached to a heat-generating semiconductor substrate or a heat-generating semiconductor package by means of the configuration as described above.

BRIEF DESCRIPTION OF DRAWINGS

FIG. 10 is a diagram of an evaluation result of adhesion of the sintered silver coating film in samples when a parameter is a humidity during firing treatment in the sintering process of the example.

MODES FOR CARRYING OUT THE INVENTION

Figure 1:
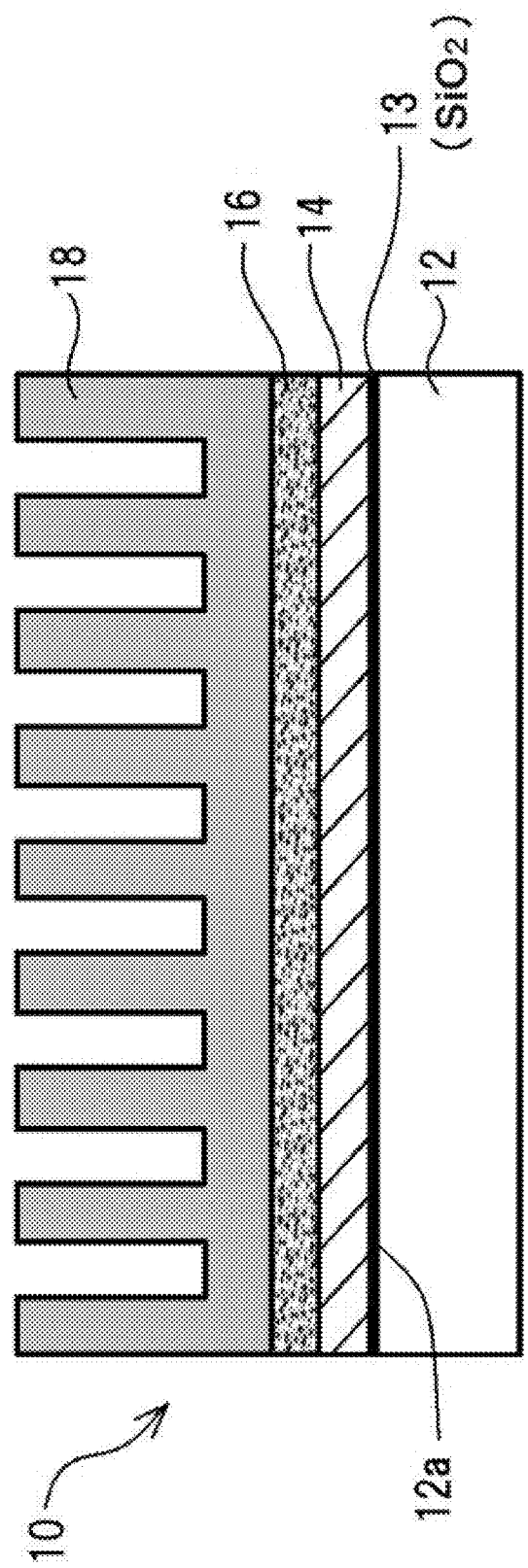
FIG. 1 is a cross-sectional view of a configuration of a semiconductor device in an embodiment of the present invention.

In the present invention, the silicone oxidation film preferably has a film thickness of 1 to 200 nm and therefore can impart excellent adhesion and thermal conductivity between a semiconductor substrate and a silver thin film.

In a preferable form of the present invention, the silver thin film is a sintered silver coating film acquired by coating one surface of a semiconductor substrate with a silver ink or a silver paste containing coated silver ultrafine particles covered with an alkylamine-based protection molecule and by firing a coating film thereof. With this configuration, the sintered silver coating film excellent in adhesion and thermal conductivity can be acquired from low-temperature firing of the coating film of the silver ink or silver paste.

In another preferable form, the semiconductor substrate has silicon exposed in a bare state and closely adhering via a silicon oxidation film to a sintered silver coating film. This sintered silver coating film is acquired by heating the coating film to a temperature of 100 to 250° C. under an atmosphere at a humidity of 12.1 to 24.2 g/m$^3$ by a ventilation type oven. With this configuration, the silicon oxidation film certainly having a film thickness of 1 nm or more can be acquired at an adhesion interface between the bare silicon of a semiconductor substrate surface layer portion and the sintered silver coating film.

In another preferable form, a semiconductor substrate has at least one surface covered with a silicon nitride film such that the silicon nitride film closely adheres via a silicon oxidation film to a sintered silver coating film. This sintered silver coating film is acquired by heating the coating film to a temperature of 100 to 250° C. under an atmosphere at a humidity of 18.2 to 24.2 g/m$^3$ by a ventilation type oven. With this configuration, the silicon oxidation film certainly having a film thickness of 1 nm or more can be acquired at an adhesion interface between the silicon nitride film of the semiconductor substrate surface layer portion and the sintered silver coating film.

The semiconductor substrate of the present invention is, for example, a semiconductor chip, a semiconductor wafer, and a semiconductor relay substrate (e.g., silicon interposer). The material of the semiconductor substrate is typically silicon. The silver thin film (particularly, sintered silver coating film) can be fabricated on a surface of a silicon substrate exposed in a bare state. A surface of the silicon substrate may be covered with an inorganic film containing silicon, for example, a silicon oxide ($SiO_2$) layer or a silicon nitride (SiN) layer, and the silver thin film (particularly, sintered silver coating film) can preferably be fabricated on such a silicon-based inorganic film.

A semiconductor package of the present invention is, for example, a ceramic package or a resin package. The ceramic package is made up of a frame body made of ceramic material such as alumina, aluminum nitride, and mullite and an upper lid body and has a semiconductor element or a semiconductor substrate (semiconductor chip) disposed and sealed inside. The resin package has a resin case with a semiconductor chip disposed inside and a resin cover covering the resin case and the semiconductor chip is tightly sealed and housed inside. A resin preferably used as a material of the resin package is a resin filled with a filler having a favorable electrical insulation property and high thermal conductivity, for example, a filler such as aluminum oxide, aluminum nitride, silicon nitride, boron nitride, and silica (silicon oxide). A surface disposed with the silver thin film of the semiconductor package may be provided with an inorganic layer containing silicon such as a silicon oxide ($SiO_2$) layer and a silicon nitride (SiN) layer.

An Embodiment of the present invention will now be described in more detail with reference to the accompanying drawings.

Semiconductor Device in Embodiment

FIG. 1 shows a configuration example of a semiconductor device in an embodiment of the present invention. In a shown semiconductor device 10, a semiconductor substrate 12 is a heat-generating semiconductor chip or semiconductor relay substrate incorporated with an integrated circuit or wirings (not shown). On one surface, i.e., a heat dissipation surface 12a, of the semiconductor substrate 12, a sintered silver coating film 14 is fabricated by a sintered silver coating film fabrication method and a firing apparatus described later. Additionally, for example, a heat dissipation fin (heat sink) 18 made of, for example, copper or aluminum is coupled onto the sintered silver coating film 14 via an adhesion layer 16. For the adhesion layer 16, for example, a metal paste, a thermally-conductive adhesive, a solder, or a thermally-conductive grease is used. In another available configuration example of a heat dissipation portion, the adhesion layer 16 is eliminated, i.e., the heat dissipation fin 18 is placed directly on the sintered silver coating film 14.

Figure 2:
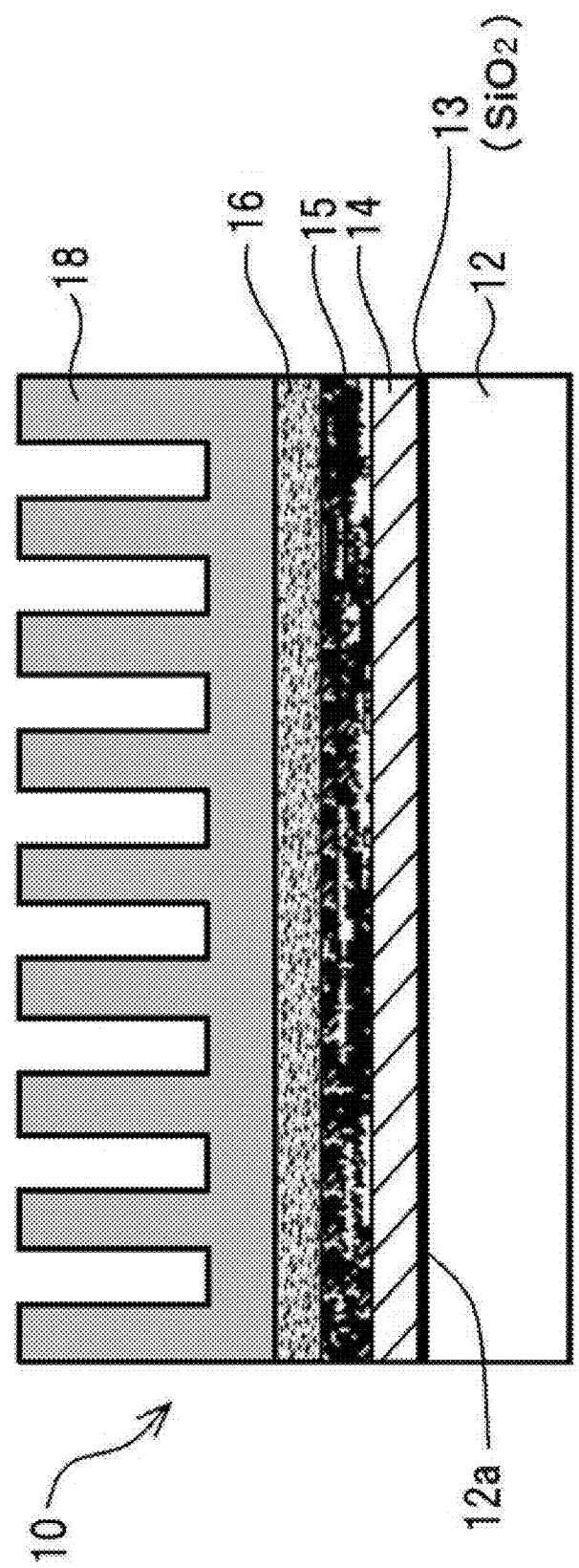
FIG. 2 is a cross-sectional view of a configuration of a semiconductor device in another embodiment.

Alternatively, in another embodiment, a structural member made of metal etc., for example, a thermal interface material (TIM) 15 can be disposed on the sintered silver coating film 14 as shown in FIG. 2, and the heat dissipation fin (heat sink) 18 can be joined or connected onto the TIM 15 via the adhesion layer 16.

Figure 3A:
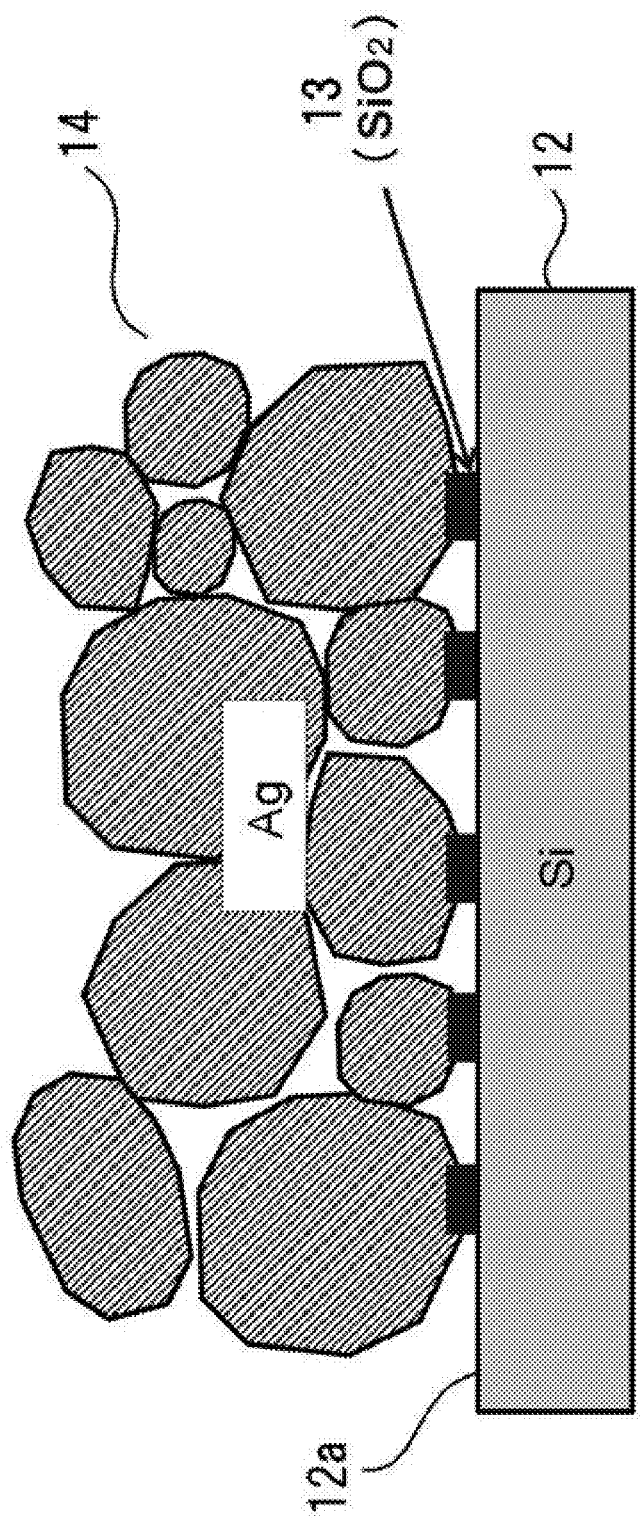
FIG. 3A is a schematic diagram of a cross-sectional structure of a main portion in the semiconductor device (near an interface between a Si surface layer portion and a sintered silver coating film of a semiconductor substrate).
Figure 3B:
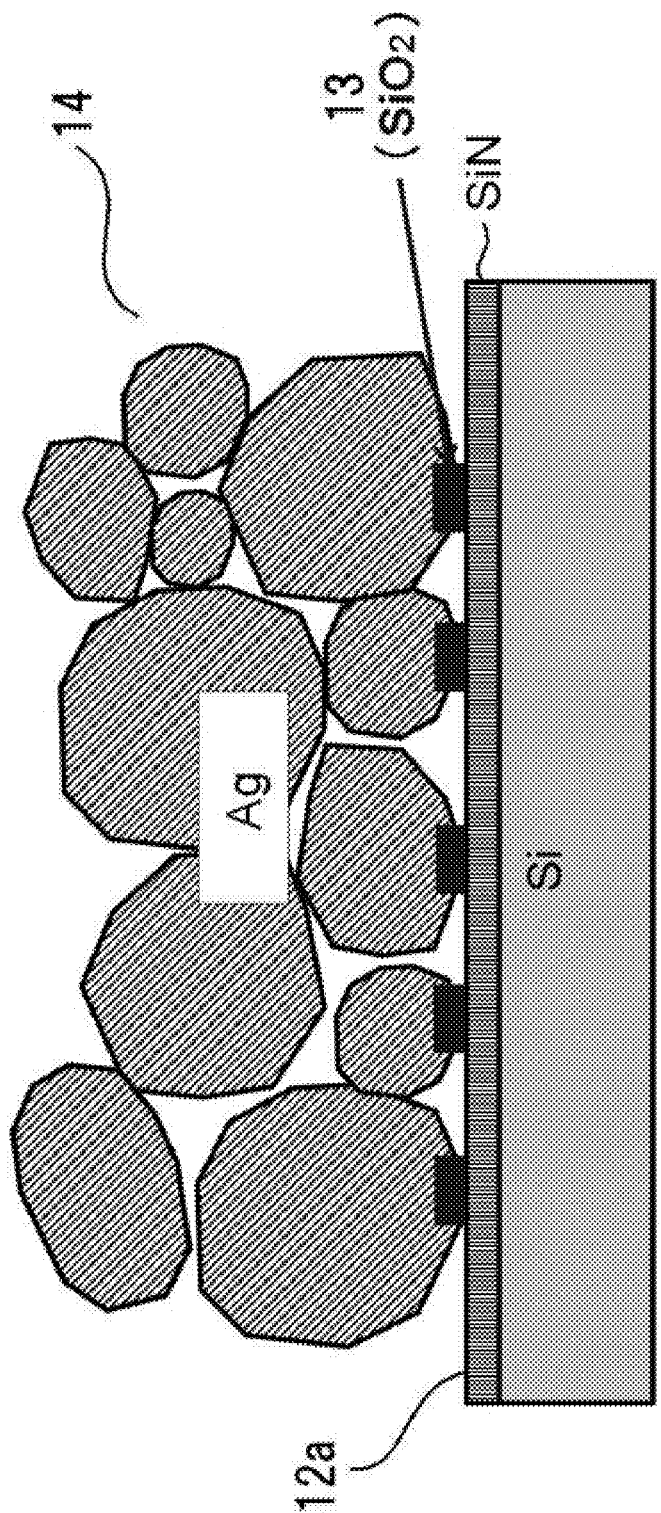
FIG. 3B is a schematic diagram of a cross-sectional structure of a main portion in the semiconductor device (near an interface between a SiN surface layer portion and the sintered silver coating film of the semiconductor substrate).

In the semiconductor device 10, at least the heat dissipation surface 12a of the semiconductor substrate 12 has silicon (Si) of the substrate exposed in a bare state as shown in FIG. 3A or is covered with a silicon nitride (SiN) film as shown in FIG. 3B. Onto such a Si surface layer portion or SiN surface layer portion 12a of the semiconductor substrate 12, the sintered silver coating film 14 closely adheres via a silicon oxide ($SiO_2$) film or a silicon oxidation film 13. The silicon oxidation film 13 may be present and have a thickness of a certain value, i.e., 1 nm or more, at least at an adhesion interface between the Si surface layer portion or SiN surface layer portion 12a of the semiconductor substrate 12 and the sintered silver coating film 14 and may not necessarily be present with a thickness of 1 nm or more on the entire surface of the substrate.

The semiconductor device 10 has the sintered silver coating film 14 extremely excellent in adhesion and thermal conductivity to the heat dissipation surface 12a of the semiconductor substrate 12, and the heat generated by the semiconductor substrate 12 is efficiently transmitted through the sintered silver coating film 14 to the heat dissipation fin 18 and dissipated from the heat dissipation fin 18. This enables the integrated circuit mounted on the semiconductor substrate 12 to stably operate within a range of allowable temperature.

When considered as a workpiece subjected to the application of the sintered silver coating film fabrication method and the firing apparatus of this embodiment described later, the semiconductor substrate 12 may be a semiconductor chip or a semiconductor relay substrate in a final product form as described above or may be a semiconductor wafer before completion of a semiconductor device.

Sintered Silver Coating Film Fabrication Method and Firing Apparatus in Embodiment The sintered silver coating film fabrication method of this embodiment includes following first process, i.e., coating process (1), and second process, i.e., sintering process (2).

(1) First, a coating film of ink or paste containing nano-silver particles (coated silver ultrafine particles covered with an alkylamine-based protection molecule) is formed on the heat dissipation surface or treated surface (surface layer portion) 12a of the semiconductor substrate 12.

(2) The coating film is heated and sintered under predetermined humidity condition and temperature condition by a ventilation type oven.

Figure 4:
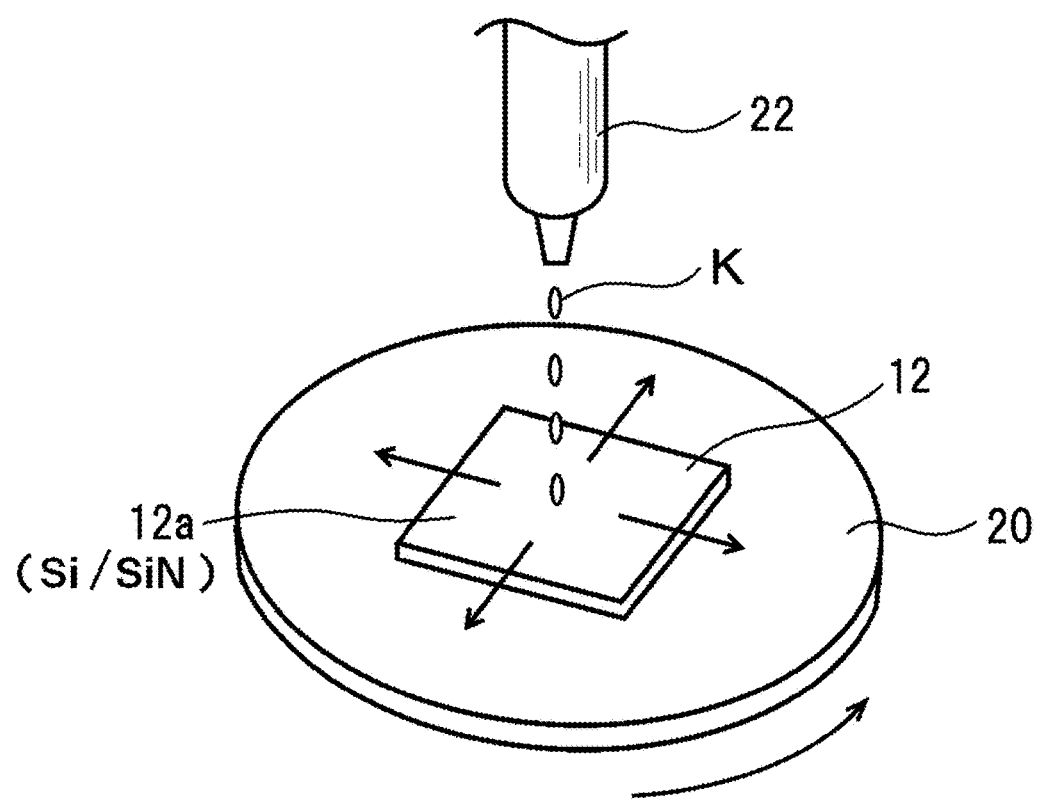
FIG. 4 is a perspective view of a film forming process in the embodiment.
Figure 5:
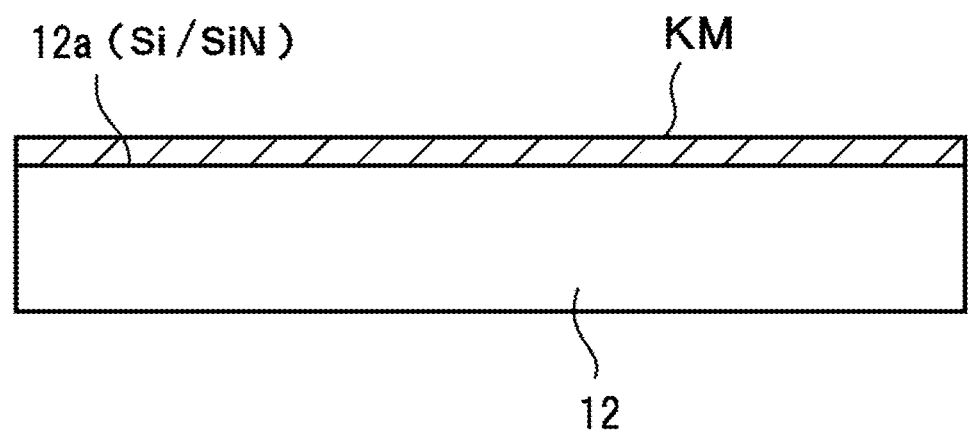
FIG. 5 is a cross-sectional view of a state in which the sintered silver coating film is formed on the semiconductor substrate by the film forming process.

FIG. 4 shows the coating process (1) using a spin coating method. As shown, the semiconductor substrate 12 with the treated surface 12a facing upward is placed and fixed onto a rotating circular plate 20 and a silver ink (or silver past) K is dropped from a dropping port of a dropping apparatus 22 to a center portion of the semiconductor substrate 12 while the semiconductor substrate 12 is spin-rotated integrally with the rotating circular plate 20. As a result, a droplet of the silver ink K is spread from the center portion to a peripheral portion by a centrifugal force of spin rotation and a coating film KM having a uniform film thickness is formed on the treated surface 12a of the semiconductor substrate 12 as shown in FIG. 5. The silver ink K contains nano-silver particles (coated silver ultrafine particles covered with an alkylamine-based protection molecule).

More specifically, the silver ink K contains nano-silver particles having an average particle diameter of 10 to 200 nm and a particle diameter of 5 nm or more at 20% in cumulative distribution from the smallest particle diameter in particle size distribution. Alternatively, the silver ink K contains nano-silver particles having a volume resistance value of 100 $\mu\Omega\cdot cm$ or less after sintering by heating at 150° C. for 2 hours and a volume resistance value of 10 $\mu\Omega\cdot cm$ or less after sintering by heating at 200° C. for 2 hours.

Moreover, the silver ink K contains any one of, or two or more of, alkylamines with the carbon number of 4 to 18 and a steam pressure of 7 mmHg or more at 135° C. Alternatively, the silver ink K contains anyone of, or two or more of, butylamine, pentylamine, hexylamine, heptylamine, octylamine, decylamine, dodecylamine, and oleylamine.

The coating film KM formed on the semiconductor substrate 12 also contains the same nano-silver particles (coated silver ultrafine particles covered with an alkylamine-based protection molecule) as the silver ink K.

At the coating process (1), the treated surface 12a of the semiconductor substrate 12 may or may not have the silicon oxidation film 13 with an arbitrary thickness formed in advance. Therefore, the silicon oxidation film 13 may not or almost not be present on the treated surface 12a of the semiconductor substrate 12 at the time of coating.

Figure 6:
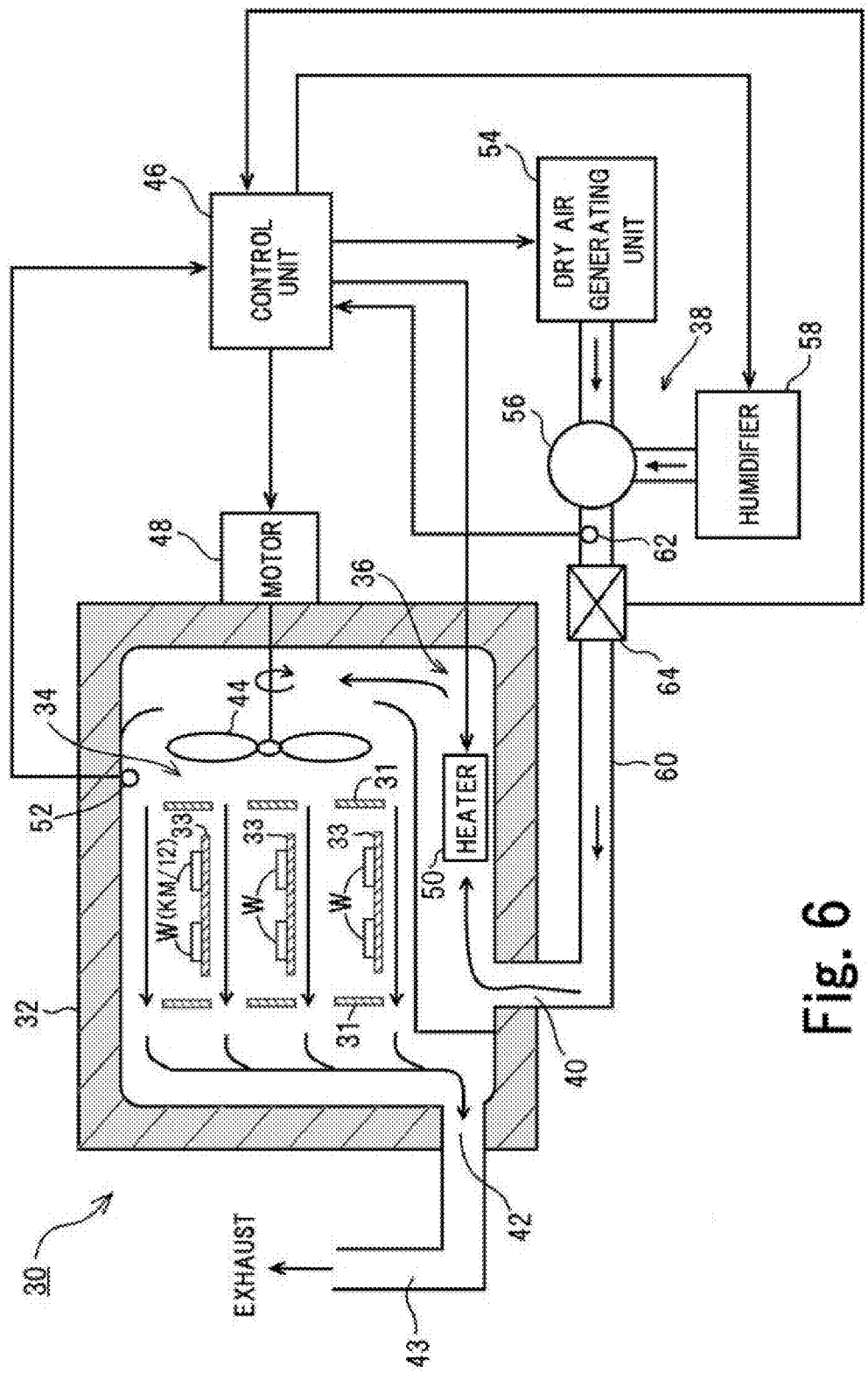
FIG. 6 is a cross-sectional view of a configuration example of a firing apparatus usable in a firing process in the embodiment.

FIG. 6 shows a configuration example of the firing apparatus in this embodiment usable in the sintering process (2). This firing apparatus 30 is configured as a ventilation type oven applying a firing treatment while interchanging air in a chamber with outside air. More specifically, the firing apparatus 30 has a chamber 32 allowing putting in and out of a workpiece W (KM/12), i.e., the semiconductor substrate 12 having the ink coating film KM containing the nano-silver particles formed on one surface at the coating process (1) such that a plurality of the workpieces W can be housed at a time in a firing chamber disposed with partition walls or current plates 31 and stages 33, for example. The firing apparatus 30 has a ventilation unit 34 discharging gas from the chamber 32 while introducing air into the chamber 32, a temperature adjustment mechanism 36 adjusting an atmosphere in the chamber 32 to a predetermined firing temperature, and a humidity adjustment mechanism 38 adjusting a humidity in the chamber 32 to a setting value within a certain range.

The ventilation unit 34 has an air introduction port 40 and an exhaust port 42 disposed in different locations of walls of the chamber 32, for example, a bottom wall and a side wall, respectively, and a fan 44 for moving air from the air introduction port 40 to the exhaust port 42 while stirring the air in the chamber 32. This fan 44 is driven by a motor 48 under the control of a control unit 46. The air introduction port 40 introduces humidified air having a moisture amount adjusted as described later into the chamber 32. The exhaust port 42 is an outlet discharging a gas in the chamber 32 and is opened through an exhaust pipe 43 to the atmosphere or connected to a factory exhaust duct (not shown).

The temperature adjustment mechanism 36 is made up of a heater 50 for heating the air introduced into the chamber 32 from the air introduction port 40, a temperature sensor 52 for measuring an atmosphere temperature in the chamber 32, and the control unit 46 for controlling a radiation amount of the heater 50 to match a temperature measurement value acquired by the temperature sensor 52 to a temperature setting value. The heater 50 may be any heater that radiates heat to heat surrounding air and can be an electrothermal heater, a carbon fiber heater, etc.

The humidity adjustment mechanism 38 is made up of a dry air generating unit 54 generating dry air outside the chamber 32, a humidifier 58 humidifying the dry air sent out from the dry air generating unit 54 through a mixer 56 before introduction into the chamber 32, a moisture amount sensor 62 and a flow rate sensor 64 disposed in an air duct 60 forming an air-tight air passage from an outlet of the mixer 56 to the air introduction port 40 of the chamber 32, and the control unit 46. The moisture amount sensor 62 and the flow rate sensor 64 measure a moisture amount and a flow rate, respectively, of the humidified air flowing through the duct 60. The control unit 46 calculates a moisture amount (measurement value) per unit volume of the humidified air introduced into the chamber 32 based on measurement value signals from the moisture amount sensor 62 and the flow rate sensor 64 and controls output of at least one of the dry air generating unit 54 and the humidifier 58 such that the moisture amount (measurement value) per unit volume matches a setting value.

The moisture amount sensor 62 can be, for example, an electrical resistance moisture meter, an electronic moisture meter using an electrical change in hygroscopic substance, an infrared (absorption) moisture meter utilizing infrared absorption, etc.

In this firing apparatus 30, the humidified air with moisture per unit volume adjusted constant by the humidity adjustment mechanism 38 is introduced through the air duct 60 from the air introduction port 40 into the chamber 32. The humidified air introduced into the chamber 32 is heated by the heater 50 before entering the firing chamber, passes through the firing chamber toward the exhaust port 42 due to a thrust force of the fan 44 while taking in a gas other than the air, and goes out of the chamber 32 from the exhaust port 42.

During the firing treatment, the ventilation unit 34, the temperature adjustment mechanism 36, and the humidity adjustment mechanism 38 having the configurations described above provide respective functions or actions under the control of the control unit 46 so that the atmosphere in the firing chamber in the chamber 32 is managed to a constant temperature and constant humidity state in accordance with setting. In particular, for the sintering process (2), a firing temperature is controlled to 100° C. or more, preferably 100° C. or more and 250° C. or less, more preferably 100° C. or more and 200° C. or less. The humidity during the firing treatment is adjusted depending on a material of the treated surface or surface layer portion 12a of the semiconductor substrate 12 and is adjusted to, for example, a range of 12.1 to 24.2 g/m$^3$ if the material of the substrate treated surface 12a is silicon (Si) and a range of 18.2 to 24.2 g/m$^3$ if the material of the substrate surface layer portion 12a is silicon nitride (SiN).

Figure 7:
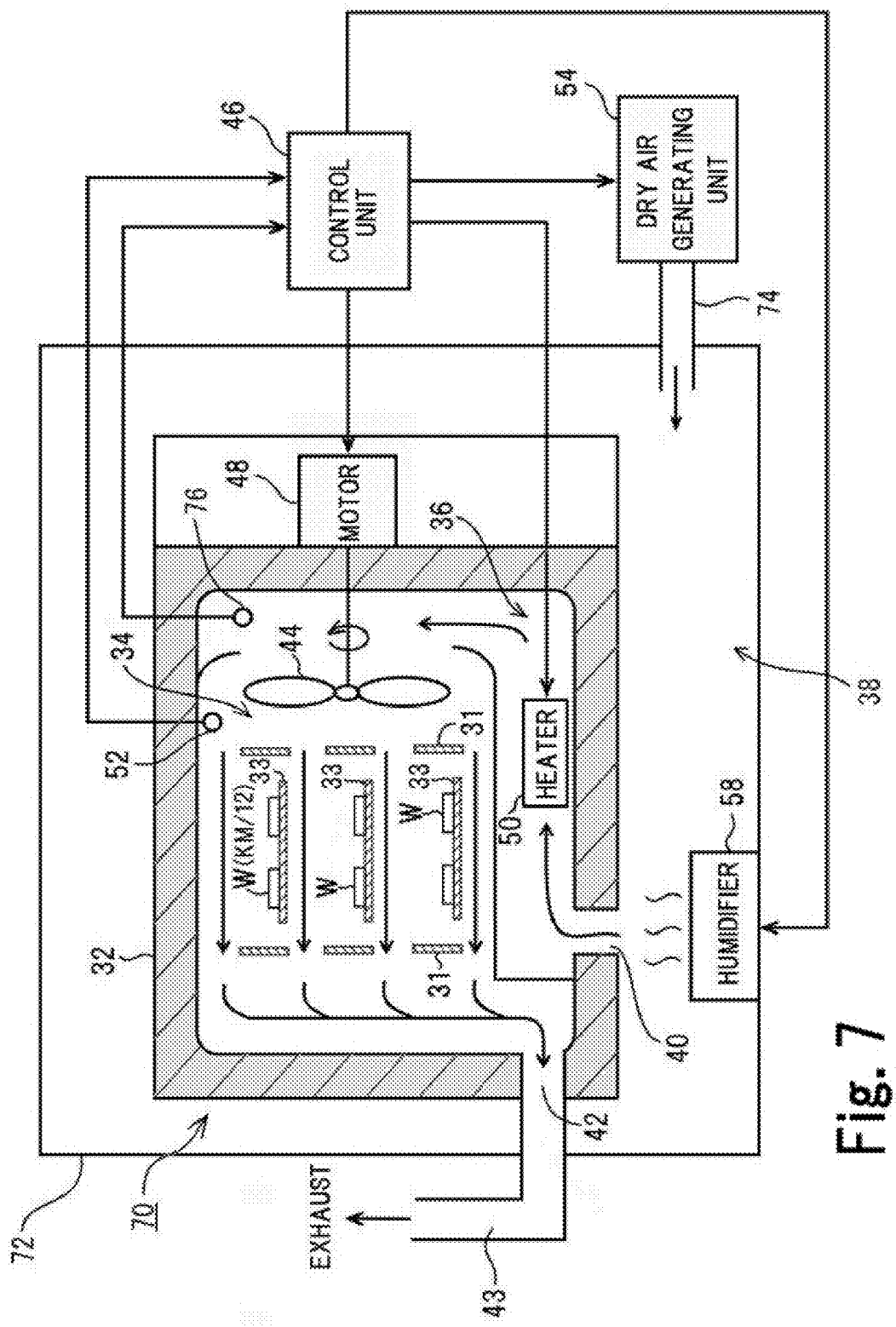
FIG. 7 is a cross-sectional view of another configuration example of a firing apparatus usable in the firing process.

FIG. 7 shows a variation of the firing apparatus in the embodiment. In FIG. 7, the portions having the same configuration or function as the firing apparatus of FIG. 6 are denoted by the same reference numerals.

This firing apparatus 70 has the chamber 32 disposed in an air-conditioned chamber 72 that is a closed space, with the air introduction port 40 opened. Into the air-conditioned chamber 72, dry air is sent through an air duct 74 from the dry air generating unit 54 and the humidifier 58 is disposed near the air introduction port 40. As a result, the dry air from the dry air generating unit 54 is humidified mainly near the air introduction port 40 (not only outside but also inside the chamber 32) and is heated by the heater 50 in the chamber 32. The humidity adjustment mechanism 38 of the firing apparatus 70 has a humidity sensor 76 disposed inside the chamber 32. The control unit 46 controls output of at least one of the dry air generating unit 54 and the humidifier 58 such that a moisture measurement value acquired by the humidity sensor 76 matches a setting value.

Also in the firing apparatus 70, during the firing treatment, the ventilation unit 34, the temperature adjustment mechanism 36, and the humidity adjustment mechanism 38 provide respective functions or actions under the control of the control unit 46 so that the atmosphere in the firing chamber in the chamber 32 is managed to a constant temperature and constant humidity state in accordance with setting. In particular, for the sintering process (2), a firing temperature is controlled to 100° C. or more, preferably 100° C. or more and 250° C. or less, more preferably 100° C. or more and 200° C. or less. The humidity during the firing treatment is adjusted depending on a material of the treated surface or surface layer portion 12a of the semiconductor substrate 12 and is adjusted to, for example, a range of 12.1 to 24.2 g/m$^3$ if the material of the substrate surface layer portion 12a is silicon (Si) and a range of 18.2 to 24.2 g/m$^3$ if the material of the substrate surface layer portion 12a is silicon nitride (SiN).

EXAMPLE

An example of the present invention will hereinafter be described with reference to FIGS. 8 to 15. Particularly, description will be made of firing conditions (a type of sample, humidity during firing, firing temperature) in the sintered silver coating film fabrication method of the example and evaluation of adhesion and thermal conductivity of a fabricated sintered silver coating film.

A dispersion liquid containing dispersed coated silver ultrafine particles used in this example is a silver nano-ink manufactured by Tanaka Kikinzoku Kogyo K.K. This silver nano-ink satisfies all the conditions of the silver ink K of the present invention and contains silver fine particles having a particle diameter of 10 to 50 nm with octane butanol used as solvent, and the silver fine particles have an alkylamine-based organic protection film.

On the other hand, the samples (semiconductor substrates) 12 of this example were acquired by preparing three bare 30 mm×30 mm semiconductor chips made up of silicon substrates, i.e., Si bare chips [Si] (No. 1 to No. 3), and three 30 mm×30 mm semiconductor chips having a silicon nitride (SiN) film formed on the chip treated surface (surface layer portion) 12a, i.e., SiN-coated chips [SiN] (No. 4 to No. 6).

In this example, before the coating process (1), all the samples 12 were immersed in 1% hydrofluoric acid for two minutes to perform a surface washing treatment. As a result, all the samples 12 had almost no oxide film on the chip treated surface (surface layer portion) 12a at the time of the coating treatment.

For the coating process (1), the spin coating method (FIG. 4) as described above was used. The chip treated surfaces (surface layer portions) 12a of all the samples 12 were coated with the silver nano-ink under the same conditions to form the coating films KM of the silver nano-ink.

Figure 8:
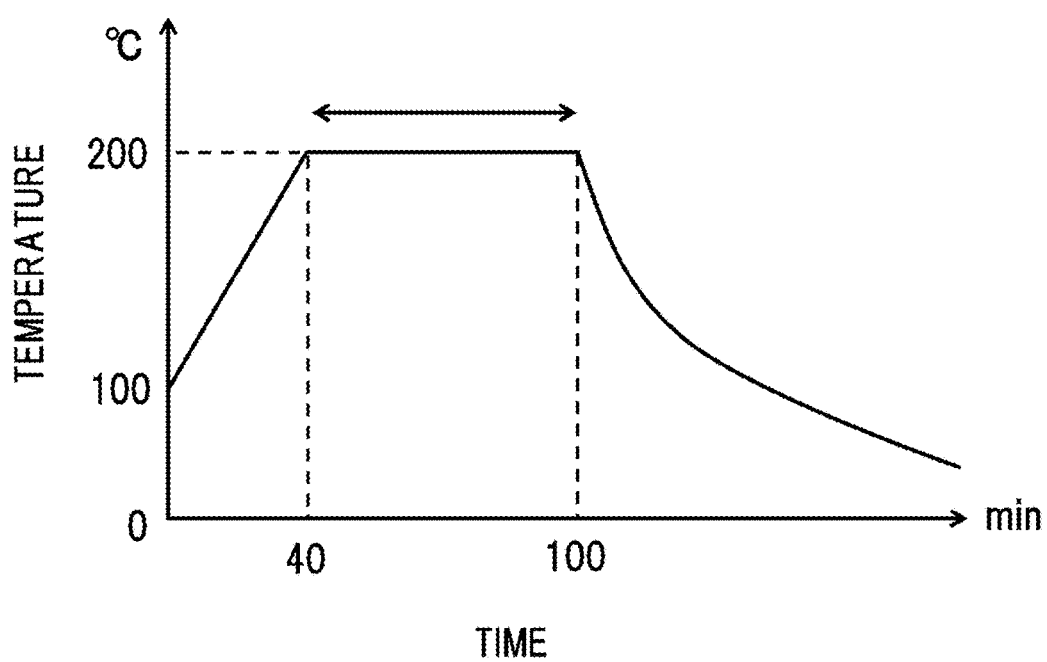
FIG. 8 is a diagram for explaining a temperature condition in a sintering process of an example.

For the sintering process (2), the firing apparatus 70 shown in FIG. 7 was used. The temperature condition of the firing treatment were the same conditions for all the samples 12. In particular, as shown in FIG. 8, the temperature is increased from 100° C. to 200° C. in about 40 minutes, retained at 200° C. for 60 minutes, and then reduced to about 80° C. in about 80 minutes before the samples were taken out of the firing apparatus 70.

In the sintering process (2), the humidity during the firing treatment was adjusted to 6.0 g/m³ for a first set of the Si bare chip [Si] No. 1 and the SiN-coated chip [SiN] No. 4, to 12.1 g/m³ for a second set of the Si bare chip [Si] No. 2 and the SiN-coated chip [SiN] No. 5, and to 18.2 g/m³ for a third set of the Si bare chip [Si] No. 3 and the SiN-coated chip [SiN] No. 6.

Figure 9:
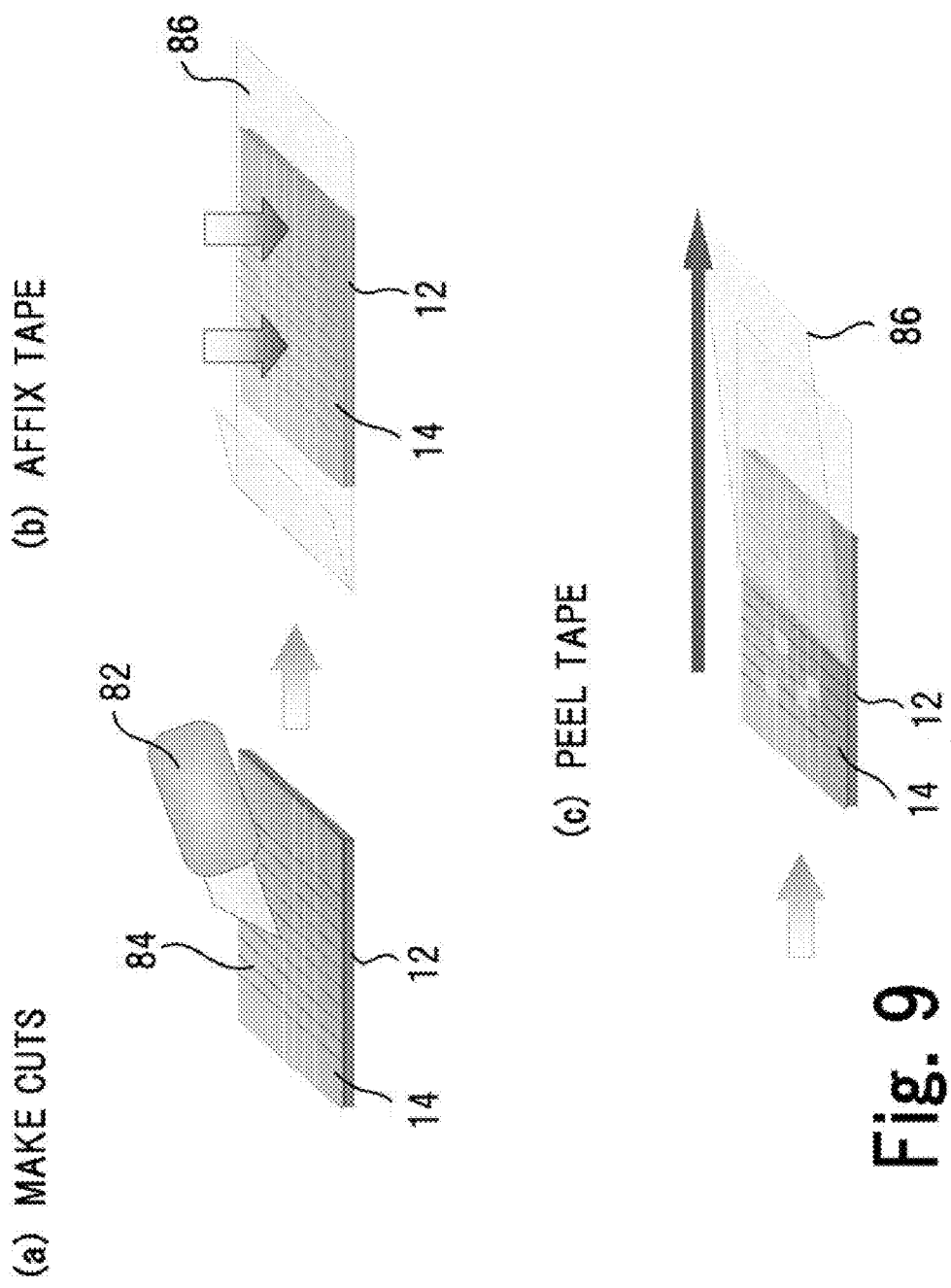
FIG. 9 is a perspective view of an adhesion evaluation test (peel test) of the sintered silver coating film in the example.

The adhesion of the sintered silver coating films 14 acquired on the chip treated surfaces (surface layer portions) 12a of the samples 12 was evaluated by a peel test (peeling test) equivalent to a cross-cut adhesion test (cross-cut peel test) conforming to JIS-K5400. FIG. 9 shows details and procedures of this peel test.

First, as shown in FIG. 9(a), cuts 84 were made in the sintered silver coating film 14 by using a utility knife 82 such that a cutting edge of the utility knife 82 penetrates the sintered silver coating film 14 and reaches the chip treated surface (surface layer portion) 12a of each of the samples 12. The cuts 84 were made in a grid shape at intervals of 1 mm in two orthogonal directions to form a lattice pattern made up of 100 square sections (squares) in the sintered silver coating film 14.

Subsequently, as shown in FIG. 9(b), an adhesive tape (Scotch tape: 610-1PK with tape strength of 3.7 N/cm, manufactured by 3M) 86 was affixed by applying pressure such that the tape closely adheres to the sintered silver coating film 14 on each of the samples 12 without a gap. As shown in FIG. 9(c), the adhesive tape 86 affixed to the sintered silver coating film 14 on each of the samples 12 was held at an end and pulled and peeled in one direction, and the number or rate of unpeeled sections (squares) of the sintered silver coating film 14 was counted by visual observation.

For a standard for evaluating the adhesion between the chip treated surface (surface layer portion) 12a and the sintered silver coating film 14 of each of the samples 12, it was considered that the rate was 100% when the sintered silver coating film 14 was peeled from the semiconductor chip 12 in none of the 100 section (squares) and, the rate (%) of the unpeeled sections (squares) was obtained if the peeling was recognized in any of the 100 sections (squares).

FIG. 10 and Table 1 show an evaluation result of the adhesion of the sintered silver coating films 14 in all the samples [Si] No. 1 to No. 3 and [SiN] No. 4 to No. 6.

TABLE 1

| samples | humidity during firing treatment | peel test |
| --- | --- | --- |
| [Si] No. 1 | <6.0 g/m³ | 0% |
| [Si] No. 2 | 12.1 g/m³ | 96% |
| [Si] No. 3 | 18.2 g/m³ | 98% |
| [SiN] No. 4 | <6.0 g/m³ | 81% |
| [SiN] No. 5 | 12.1 g/m³ | 3% |
| [SiN] No. 6 | 18.2 g/m³ | 100% |

As shown in FIG. 10 and Table 1, the Si bare chip [Si] No. 1 subjected to the firing treatment at a humidity of 6.0 g/m³ or less had no section (square) (0%) without peeling in the peel test. In other words, the peeling occurred in all the 100 sections (squares). In contrast, the Si bare chip [Si] No. 2 subjected to the firing treatment at the humidity of 12.1 g/m³ had 96 sections (squares) (96%) without peeling in the peel test. The Si bare chip [Si] No. 3 subjected to the firing treatment at the humidity of 18.2 g/m³ had 98 sections (squares) (98%) without peeling in the peel test.

As described above, in the case of the Si bare chips [Si], the humidity of the firing treatment is preferably adjusted to 12.1 g/m³ or more in the sintering process (2) using the ventilation type sintering apparatus (30, 70) as described above and, as a result, the sintered silver coating film 14 excellent in adhesion can certainly be created on the chip treated surface or surface layer portion 12a.

However, if the humidity of the firing treatment exceeds 24.2 g/m³ in a ventilation type oven, the adhesion may significantly be reduced due to condensation during firing and this is not desirable. Therefore, the humidity of the firing treatment in the sintering process (2) is preferably adjusted to 24.2 g/m³ or less.

As shown in FIG. 10 and Table 1, the SiN-coated chip [SiN] No. 4 subjected to the firing treatment at a humidity of 6.0 g/m³ or less had 81 sections (squares) (81%) without peeling in the peel test, which was not so bad. However, the SiN-coated chip [SiN] No. 5 subjected to the firing treatment at the humidity of 12.1 g/m³ had only 3 sections (squares) (3%) without peeling in the peel test. In contrast, the SiN-coated chip [SiN] No. 6 subjected to the firing treatment at the humidity of 18.2 g/m³ had 100 sections (squares) (100%) without peeling in the peel test.

As described above, in the case of the SiN-coated chips [SiN], the humidity of the firing treatment is preferably adjusted to a range of 18.2 to 24.2 g/m³ in the sintering process (2) using the ventilation type sintering apparatus (30, 70) as described above and, as a result, the sintered silver coating film 14 excellent in adhesion can certainly be created on the chip treated surface or surface layer portion 12a.

Figure 11:
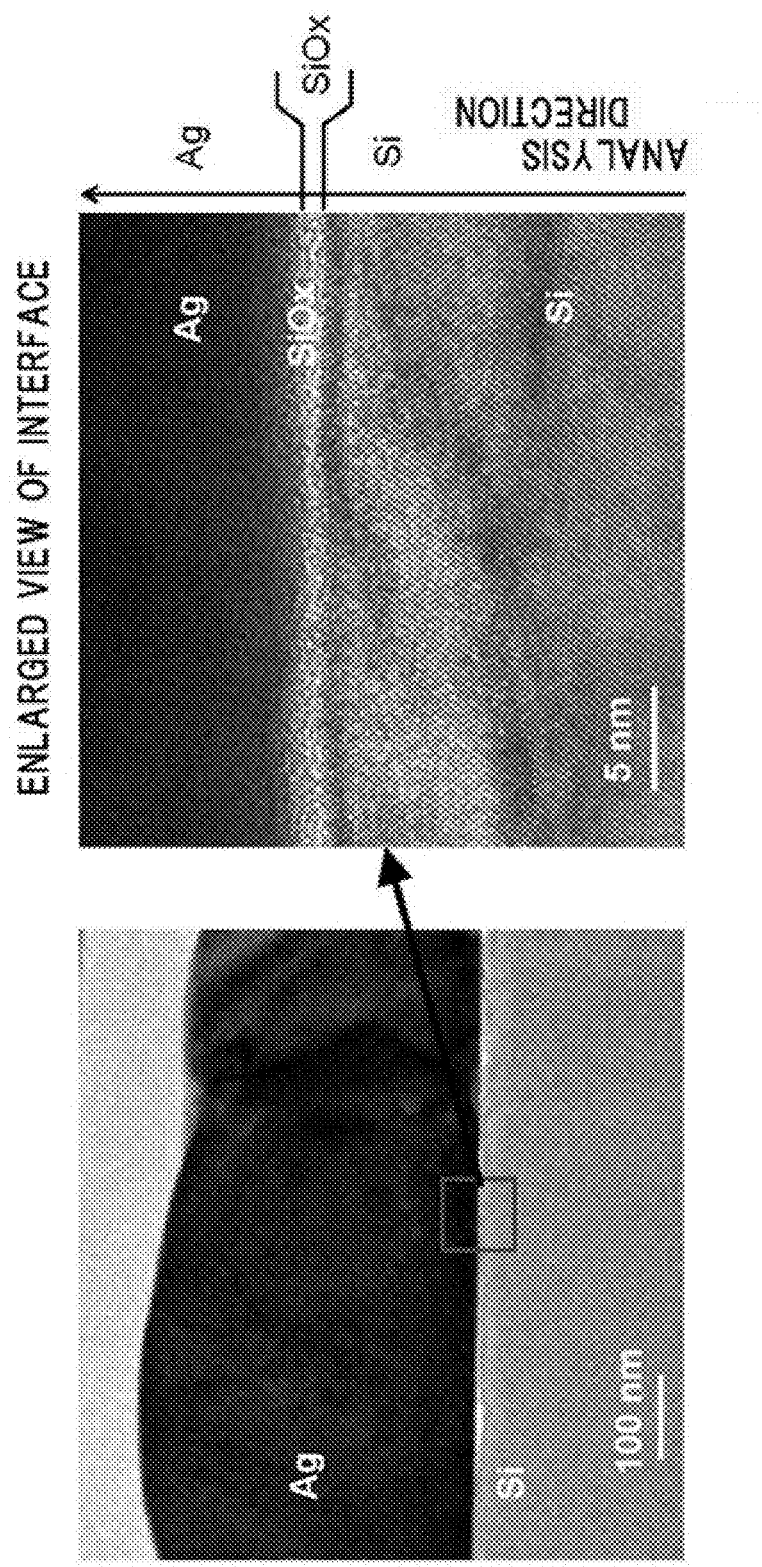
FIG. 11 is a diagram of a cross-sectional structure (TEM cross-sectional photograph) near an adhesion interface between a chip surface layer portion and the sintered silver coating film in a sample (Si bare chip) providing favorable adhesion in the example.
Figure 12:
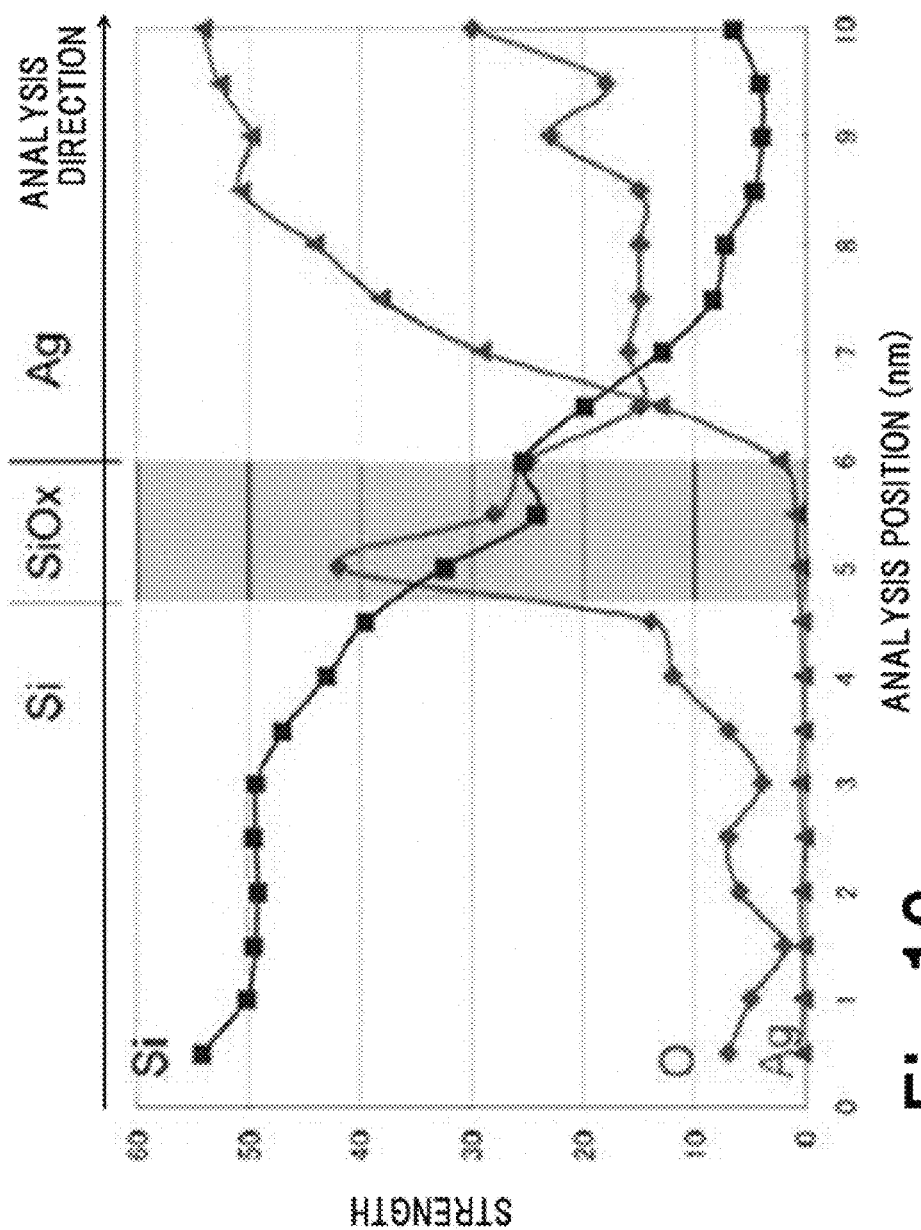
FIG. 12 is a diagram of a result of EDS analysis in the sample (Si bare chip).
Figure 13:
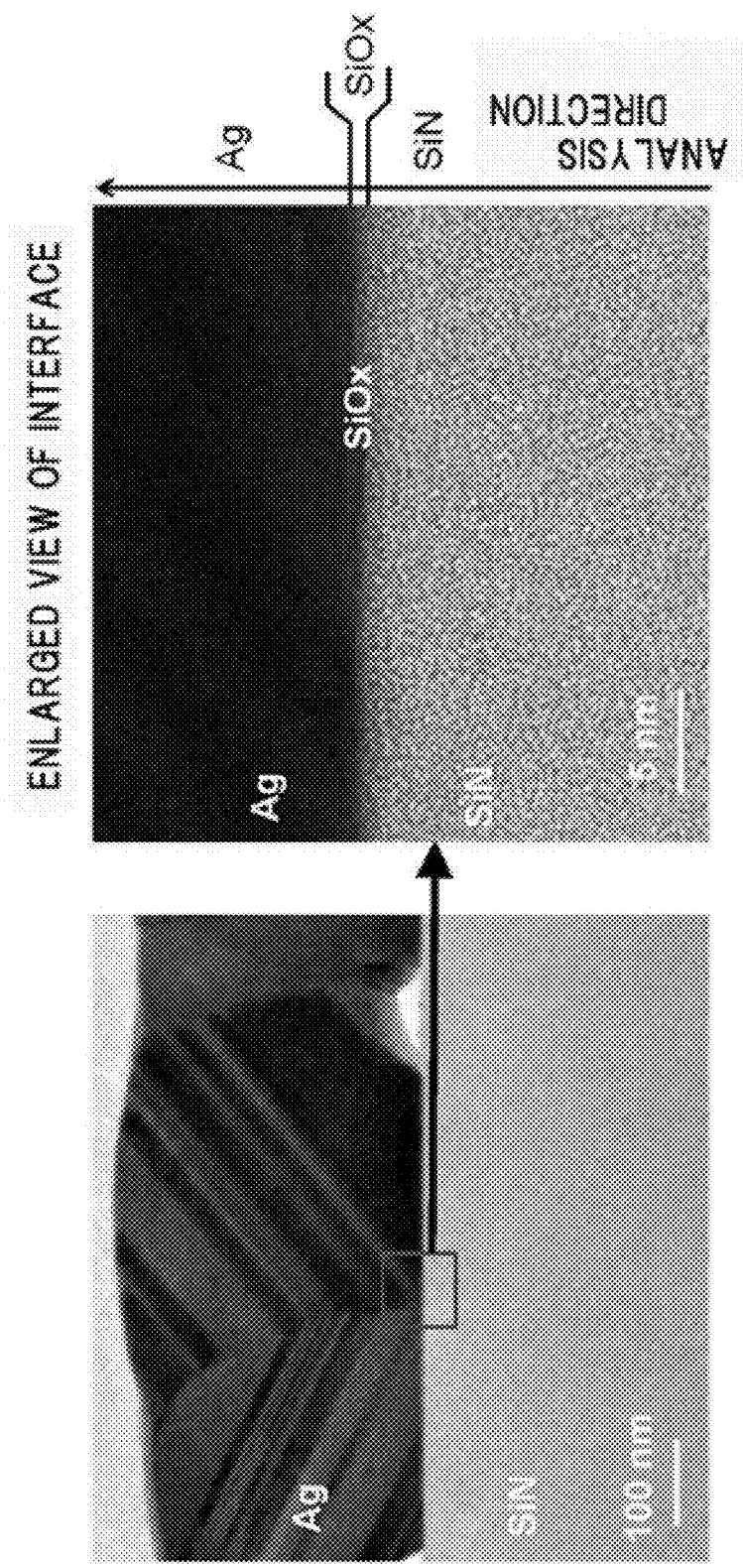
FIG. 13 is a diagram of a cross-sectional structure (TEM cross-sectional photograph) near an adhesion interface between a chip surface layer portion and the sintered silver coating film in a sample (SiN-coated chip) providing favorable adhesion in the example.
Figure 14:
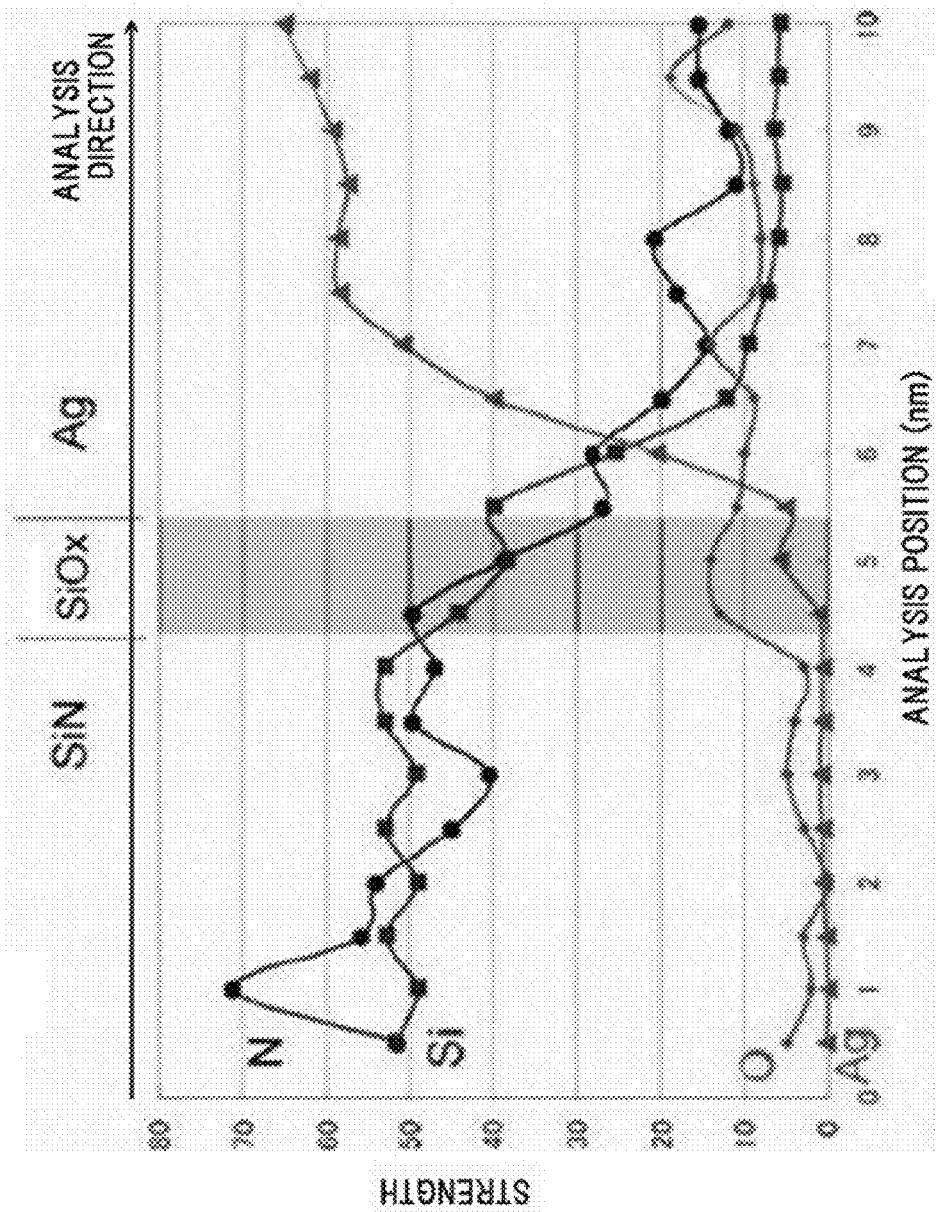
FIG. 14 is a diagram of a result of EDS analysis in the sample (SiN-coated chip).

When the present inventors analyzed a structure near an adhesion interface between the chip surface layer portion 12a and the sintered silver coating film 14 of the Si bare chip [Si] No. 3 and the SiN-coated chip [SiN] No. 6 having particularly favorable adhesion in the example by using a TEM (transmission electron microscope) incorporated with an EDS (Energy dispersive X-ray spectrometry) apparatus, TEM cross-sectional photographs as shown in FIGS. 11 and 13 and EDS analysis results as shown in FIGS. 12 and 14 were respectively acquired.

In particular, in the Si bare chip [Si] No. 3, the presence of a thin film of different material was observed at the adhesion interface between the treated surface or surface layer portion 12a (Si) and the sintered silver coating film 14 (Ag) of the semiconductor chip 12 as shown in FIG. 11, and it was confirmed that this thin film is a silicon oxide ($SiO_x$) film and has a film thickness of 1 nm or more as shown in FIG. 12.

As described above, for the Si bare chips [Si], the sintered silver coating film 14 excellent in adhesion can certainly be created on the chip surface layer portion 12a by forming the coating film KM of the silver ink (or silver paste) K containing the coated silver ultrafine particles covered with an alkylamine-based protection molecule on the chip treated surface or surface layer portion 12a and by heating the coating film KM to a temperature of 100 to 250° C. under an atmosphere having a humidity of 12.1 to 24.2 g/m³ by the ventilation type firing apparatus. In this case, in the sintering process (2), the silicon oxidation film 13 having a film thickness certainly exceeding 1 nm can be formed at the adherence interface between the chip surface layer portion 12a and the sintered silver coating film 14.

Also in the SiN-coated chip [SiN] No. 6, the presence of a thin film of different material was observed at the adhesion interface between the surface layer portion 12a (SiN) and the sintered silver coating film 14 (Ag) of the semiconductor chip 12 as shown in FIG. 13, and it was confirmed that this thin film is a silicon oxide ($SiO_x$) film and has a film thickness of 1 nm or more as shown in FIG. 14.

As described above, for the SiN-coated chips [SiN], the sintered silver coating film 14 excellent in adhesion can certainly be created on the chip surface layer portion 12a by forming the coating film KM of the silver ink (or silver paste) K containing the coated silver ultrafine particles covered with an alkylamine-based protection molecule on the chip treated surface or surface layer portion 12a and by heating the coating film KM to a temperature of 100 to 250° C. under an atmosphere at a humidity of 18.2 to 24.2 g/m³ by the ventilation type firing apparatus. In this case, in the sintering process (2), the silicon oxidation film 13 having a film thickness certainly exceeding 1 nm can be formed at the adherence interface between the chip surface layer portion 12a and the sintered silver coating film 14.

On the other hand, the present inventors evaluated the thermal conductivity for the sintered silver coating film 14 acquired by using the sintered silver coating film fabrication method and the firing apparatus of this example. In particular, for the sintered silver coating films 14 created on the chip treated surfaces (surface layer portions) 12a of the samples in the example, a surface resistivity (Ω/sq) was measured by a four-probe sheet resistance measurement device and a film thickness (nm) was measured from a TEM photograph to obtain an electrical resistivity or volume resistivity $\rho$ (μΩ·cm) of the sintered silver coating films 14. As a result, the electrical resistivity $\rho$ (μΩ·cm) of the sintered silver coating films 14 was 2.5 to 2.7 in all the samples [Si] No. 1 to No. 3 and [SiN] No. 4 to No. 6.

Figure 15:
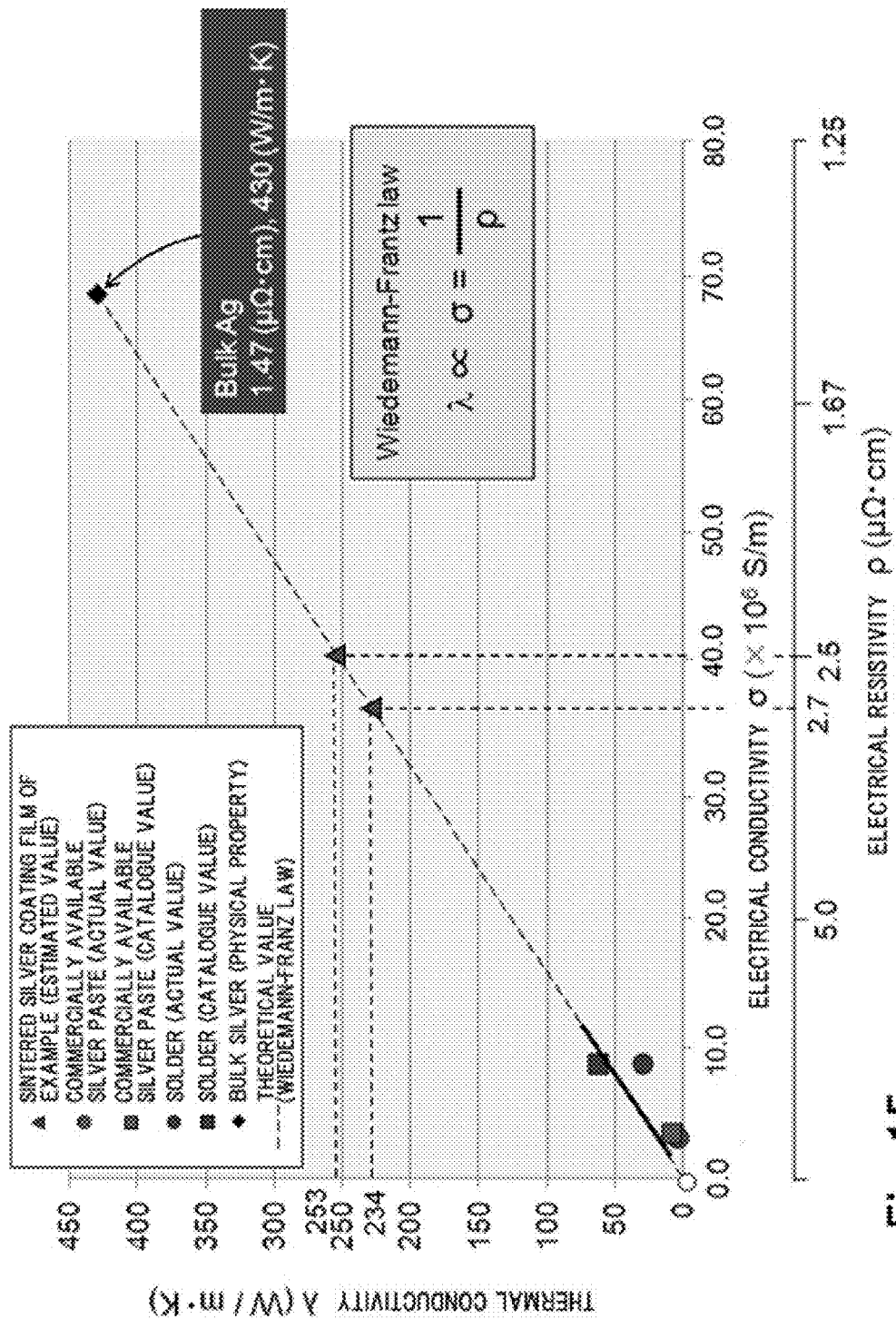
FIG. 15 is a diagram of a graph of relation between electric resistivity and thermal conductivity based on the Wiedemann-Franz law.

A thermal conductivity $\lambda$ (W/(m·K)) of a sintered silver coating film can be estimated from an electrical resistivity $\rho$ (Ω·cm) of the sintered silver coating film. When the electrical resistivity $\rho$ (μΩ·cm) and the thermal conductivity $\lambda$ (W/(m·K)) of bulk silver are defined as 1.47 and 430, respectively, and the Wiedemann-Franz law ($\lambda \propto \rho = 1/\rho$) is used, as shown in FIG. 15, the electrical resistivity $\rho$ (μΩ·cm) of 2.5 to 2.7 leads to the thermal conductivity $\lambda$ (W/(m·K)) of 234 to 253 (estimated value) in the sintered silver coating film 14 of the example.

The thermal conductivity $\lambda$ (W/(m·K))=234 to 253 of the sintered silver coating film 14 of the example is an extremely large value as compared to the thermal conductivity of about 10 of commercially available silver paste and the thermal conductivity of about 50 of commercially available solder. Therefore, it can be understood that the sintered silver coating film 14 has extremely favorable thermal conductivity. As a result, the sintered silver coating film 14 can be used as a heat spreader with a small heat resistivity and a large heat dissipation effect.

With regard to the adhesion between the semiconductor substrate 12 and the sintered silver coating film 14, as described above, the silicon oxidation film 13 present as an adhesion layer at the adhesion interference therebetween does no harm even when the film thickness is excessively large. However, with regard to the thermal conductivity, a smaller film thickness of the silicon oxidation film 13 is more preferable. If the sintered silver coating film fabrication method and the firing apparatus of the embodiment described above are applied to a general semiconductor chip or semiconductor relay substrate, the film thickness of the silicon oxidation film 13 is preferably set to 1 nm or more as in the example in terms of adhesion and the film thickness of the silicon oxidation film 13 is preferably set to 200 nm or less from in terms of thermal conductivity.

Other Embodiments and Variations

Although the hydrofluoric acid treatment (surface washing treatment) is applied to the samples 12 before the coating process (1) in the example, such a hydrofluoric acid treatment can be eliminated. In this case, a silicon oxidation film of an arbitrary film thickness may already be deposited or formed on the treated surface (surface layer portion) 12a of the semiconductor substrate 12.

When the inventors executed the coating process (1) and the sintering process (2) under the same conditions as the example for the three Si bare chips [Si] No. 1 to No. 3 and the three SiN-coated chips [SiN] No. 4 to No. 6 having a silicon oxidation film with a thickness of 1 nm or more formed in advance on the treated surface (surface layer portion) 12a, all the samples consequently had 100 sections (squares) (100%) without peeling in the peel test and the favorable adhesion was acquired.

Although a film thickness of a Si natural oxidation film is normally 10 nm or less, the film thickness may not exceed 1 nm. Therefore, even if the sintered silver coating film fabrication method and the firing apparatus of the embodiment are applied to a semiconductor substrate already having a Si natural oxidation film formed on the treated surface, the humidity during the firing treatment is preferably set to 12.1 to 24.2 g/m³ for Si bare chips and the humidity during the firing treatment is preferably set to 18.2 to 24.2 g/m³ for SiN-coated chips in accordance with the example.

The semiconductor substrates of the embodiment and the example have the heat dissipation surface or surface layer portion exposed in a bare state or covered with a silicon nitride film. However, the present invention is applicable to a semiconductor substrate having the heat dissipation surface or surface layer portion covered with a silicon oxidation film.

In the embodiment and the example, description has been made of an example of fabricating the sintered silver coating film on one surface of a semiconductor substrate by the sintered silver coating film fabrication method and the firing apparatus of the present invention. However, a sintered silver coating film having the same adhesion and heat conductivity as above can be fabricated on one surface of a semiconductor package by the sintered silver coating film fabrication method and the firing apparatus of the present invention.

Although the spin coating method can advantageously be used in the coating process of the present invention, another coating method such as a printing method is also usable.

EXPLANATIONS OF LETTERS OR NUMERALS 10 semiconductor device
12 semiconductor substrate
13 silicon oxidation film
14 sintered silver coating film (heat spreader)
15 thermal interface material (TIM)
16 adhesion layer
18 heat dissipation fin
30, 70 firing apparatus
32 chamber
34 ventilation unit
36 temperature adjustment mechanism
38 humidity adjustment mechanism manufacturing
46 control unit 52 temperature sensor
62 moisture amount sensor
76 humidity sensor

The invention claimed is:

1. A semiconductor device comprising:
a heat-generating semiconductor package made of ceramic material or resin housing a heat-generating semiconductor substrate incorporated with an integrated circuit or wirings;
a silver thin film manufactured from nano-silver particles and formed by a coating method in a closely adhering manner on one surface of the semiconductor package; and
a silicon oxidation film having a film thickness of 1 nm or more formed at an adhesion interface between the semiconductor package and the silver thin film.

2. The semiconductor device of claim 1, comprising a heat sink thermally coupled to the silver thin film.

3. The semiconductor device of claim 1, wherein the silicon oxidation film has a film thickness of 1 to 200 nm.

4. The semiconductor device of claim 1, wherein the nano-silver particles have an average particle diameter of 10 to 200 nm and a particle diameter of 5 nm or more at 20% in cumulative distribution from the smallest particle diameter in particle size distribution.

* * * * *

UNITED STATES PATENT AND TRADEMARK OFFICE
CERTIFICATE OF CORRECTION

| | |
|---|---|
| PATENT NO. | : 9,607,922 B2 |
| APPLICATION NO. | : 14/778684 |
| DATED | : March 28, 2017 |
| INVENTOR(S) | : Kenji Matsuda et al. |

It is certified that error appears in the above-identified patent and that said Letters Patent is hereby corrected as shown below:

On the Title Page

Column 1, Item (22), should read:
(22) PCT Filed: Mar. 13, 2014

Signed and Sealed this
Twentieth Day of September, 2022

Katherine Kelly Vidal
*Director of the United States Patent and Trademark Office*